(12) United States Patent  
Viswanathan

(10) Patent No.: US 7,719,278 B2  
(45) Date of Patent: *May 18, 2010

(54) METHOD AND APPARATUS FOR HIGH-GAIN MAGNETIC RESONANCE IMAGING

(75) Inventor: Raju R. Viswanathan, Clayton, MO (US)

(73) Assignee: Tursiop Technologies LLC, Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/890,256

(22) Filed: Aug. 3, 2007

(65) Prior Publication Data

US 2008/0169815 A1  Jul. 17, 2008

Related U.S. Application Data

(63) Continuation of application No. 11/582,094, filed on Oct. 17, 2006.

(60) Provisional application No. 60/727,924, filed on Oct. 18, 2005.

(51) Int. Cl.
    *G01V 3/00*   (2006.01)
(52) U.S. Cl. .................................................... 324/318
(58) Field of Classification Search ......... 324/300–322; 600/410–435; 333/219–235; 343/720, 741–755, 343/767–792, 824, 866–916, 700 MS
    See application file for complete search history.

(56) References Cited

U.S. PATENT DOCUMENTS

| 4,359,706 | A | | 11/1982 | Flack |
| 5,172,061 | A | * | 12/1992 | Crooks et al. ............... 324/322 |
| 5,351,007 | A | | 9/1994 | Withers et al. |
| 6,317,619 | B1 | | 11/2001 | Boernert et al. |
| 6,828,786 | B2 | | 12/2004 | Scherer et al. |
| 7,015,393 | B2 | * | 3/2006 | Weiner et al. ................. 174/36 |
| 7,116,273 | B2 | * | 10/2006 | Morikawa et al. ..... 343/700 MS |
| 2003/0206017 | A1 | | 11/2003 | Boskamp |
| 2004/0241339 | A1 | | 12/2004 | Anazawa et al. |
| 2005/0030032 | A1 | | 2/2005 | Kwok et al. |
| 2007/0085544 | A1 | * | 4/2007 | Viswanathan ............... 324/318 |

* cited by examiner

*Primary Examiner*—Brij B Shrivastav  
*Assistant Examiner*—Dixomara Vargas  
(74) *Attorney, Agent, or Firm*—Russ Weinzimmer; Russ Weinzimmer & Associates

(57) ABSTRACT

A method and apparatus for Magnetic Resonance Imaging with specialized imaging coils possessing high Signal-to-Noise-Ratio (SNR). Imaging and/or Radio Frequency receiving coils include a ballistic electrical conductor such as carbon nanotubes, the ballistic electrical conductor having a resistance that does not increase significantly with length. Due to their enhanced SNR properties, system designs with smaller static magnetic field strength can be constructed for the same quality of imaging, leading to substantial reductions in system size and cost, as well as to enhanced imaging with existing MRI systems.

8 Claims, 13 Drawing Sheets

METHOD AND APPARATUS FOR HIGH-GAIN MAGNETIC RESONANCE IMAGING

CROSS-REFERENCES TO RELATED APPLICATIONS

This application is a continuation entitled to the benefit of U.S. patent application Ser. No. 11/582,094 entitled "METHOD AND APPARATUS FOR HIGH GAIN MAGNETIC RESONANCE IMAGING", filed Oct. 17, 2006, herein incorporated by reference.

U.S. patent application Ser. No. 11/582,094 is entitled to the benefit of U.S. Provisional Patent Application No. 60/727,924, entitled "METHOD AND APPARATUS FOR HIGH GAIN MAGNETIC RESONANCE IMAGING", filed Oct. 18, 2005, herein incorporated by reference.

FIELD OF THE INVENTION

This invention relates to diagnostic medical imaging, and more particularly to Magnetic Resonance Imaging at high Signal-to-Noise-Ratios.

BACKGROUND OF THE INVENTION

Magnetic Resonance Imaging (MRI) technology is common today in larger medical institutions worldwide, and has led to huge benefits in the practice of medicine. A significant factor impeding further increased use of this versatile imaging technology is the typically high cost of both purchase and maintenance of MRI systems.

The costs associated with the design and manufacture of such systems are due mainly to the need to generate large and very homogeneous static magnetic fields, as well as the need to generate gradient fields for imaging with such systems. Such large static fields are currently required to obtain high image quality and resolution.

SUMMARY OF THE INVENTION

The present invention includes a method and apparatus for Magnetic Resonance Imaging that uses imaging coils with high Signal-to-Noise-Ratio (SNR) to tradeoff increased SNR for lower static magnetic field strength. Various coil arrangements and system configurations are, disclosed that exploit the electrical properties of low-resistance imaging coils made of electrical conductors (called "ballistic conductors") having resistance that does not increase significantly with length of conductor, such as electrical conductors made from carbon nanotube material. An imaging system of the invention can include a homogeneous static magnetic field, or a specially-tailored inhomogeneous static magnetic field. The present invention also provides a method for constructing high-quality integrated imaging systems that are also low in weight, and in some cases, sufficiently low in weight and bulk so as to be portable.

The imaging coils of the invention are used to acquire radio frequency (RF) signals emitted by precessing proton spins in a sample to be imaged. Further, similar coils can also be used as transmitter coils to transmit RF signals needed to flip the proton spins in the sample, thereby causing them to precess.

The configuration of the imaging coils of the invention exploits the ballistic conductance property of the carbon nanotubes so as to optimize the magnetic field B1 within an imaging volume produced by the coil per unit current flowing through the coil. According to the invention, carbon nanotube conductors are made into thin films which are then formed into coils and coil arrangements that create a relatively large magnetic field B1 within the imaging volume, while also having relatively small electrical resistance, thereby providing very high SNR values.

Further, the ballistic conductance of the carbon nanotube material of the coils enables creation of RF receiving circuitry with large Quality Factors. Large Quality Factors imply maximum power reception, thereby providing high signal quality and narrow bandwidth so as to provide a Magnetic Resonance Imaging system having highly selective imaging capabilities. The narrow bandwidth that can be thereby attained can be used for efficient imaging in the presence of an inhomogeneous static magnetic field, where slice selectivity for imaging is thereby enhanced.

Due to the significantly enhanced SNR properties of the receiving coils of the invention, a smaller static magnetic field strength B1 can be used to provide the same quality of imaging as is possible with the magnetic field strength B1 of known magnet systems. Thus, a smaller magnet system can be used in the invention, thereby resulting in a magnetic resonance imaging system that is of significantly reduced size, and of significantly reduced system cost. Conversely, a standard static field magnitude B1 and the coils and coil configuration of the invention can be used to obtain images of significantly improved image quality and image resolution as compared to those obtained with standard imaging coils.

For example, the Magnetic Resonance Imaging system of the invention, receiving electrical signals from at least one RF receiving coil including an electrical conductor consisting essentially of carbon nanotube material, can acquire real-time three dimensional volumetric image data of volume at least 7 cm×7 cm×7 cm, with a voxel size less than or equal to 1 mm×1 mm×1 mm, and at a rate of better than 10 frames a second. In one general aspect of the invention, a magnetic resonance imaging system is provided having an enhanced signal-to-noise ratio. The system includes a magnet system for providing a static magnetic field having a low magnetic field strength; and at least one RF receiving coil assembly including a coiled electrical conducting element consisting essentially of carbon nanotube material; and RF receiving circuitry having a large quality factor.

In a preferred embodiment, the quality factor is substantially 100. In an alternate embodiment, the quality factor is greater than 15.

In another preferred embodiment, the magnet system for providing a static magnetic field provides a magnetic field of strength of less than about 1.5 Tesla. In an alternate embodiment, the magnet system for providing a static magnetic field provides a magnetic field of strength of between 0.1 to 1.5 Tesla. In other embodiments, the magnet system for providing a static magnetic field provides a magnetic field of strength of between 0.02 Tesla and 3.00 Tesla.

In some preferred embodiments, a plurality of RF receiving coils is included, each RF receiving coil including a coiled electrical conducting element consisting essentially of carbon nanotube material, and the plurality of RF receiving coils is configured as a phased array so as to enhance signal acquisition.

In a preferred embodiment, the at least one RF receiving coil has between 3 and 500 complete windings of electrical conducting element consisting essentially of carbon nanotube material. In other embodiments, the at least one RF receiving coil has at least 3 complete windings of electrical conducting element consisting essentially of carbon nanotube material. In a further embodiment, the windings of electrical conducting are of a winding diameter between 5 cm to 80 cm. In another further embodiment, the windings of electrical conducting are of a winding thickness between 20 nanometers and 500 microns.

In yet other preferred embodiments, the at least one RF receiving coil assembly includes an opposed pair of coiled electrical conducting elements, each coiled electrical conducting element consisting essentially of carbon nanotube material in the form of a thin carbon nanotube film structured as a tightly wound ring of carbon nanotube film of a film thickness between 20 nanometers and 500 microns, and at least 3 turns of winding.

In still other preferred embodiments, the at least one RF receiving coil includes multiple layers of windings of electrical conducting element consisting essentially of carbon nanotube material.

In preferred embodiments, the magnet system is a permanent magnet.

In other preferred embodiments, the at least one RF receiving coil can be moved by an operator. In alternate preferred embodiments, the at least one RF receiving coil includes a sensor to sense position and orientation of the at least one RF receiving coil.

In yet other preferred embodiments, the RF receiving coil includes a coiled electrical conducting element having a plurality of winding turns in a spiral pattern.

In still other preferred embodiments, the RF receiving coil includes a coiled electrical conducting element having a plurality of winding turns in a conical helical pattern. In a further preferred embodiment, the coiled electrical conducting element having a plurality of winding turns in a conical helical pattern is of an axial length L of as much as 9 cm. In another further embodiment, the coiled electrical conducting element having a plurality of winding turns in a conical helical pattern has a largest winding diameter in the range of 5 cm to 80 cm, and a smallest winding diameter being up to 20 times smaller than the largest winding diameter. In yet another further embodiment, the coiled electrical conducting element has a plurality of winding turns in a conical helical pattern, and the plurality of winding turns has between 3 winding turns to 500 winding turns.

In a preferred embodiment, the RF receiving coil includes a first coiled electrical conducting element having a plurality of winding turns in a conical helical pattern followed by at least a second coiled electrical conducting element having a plurality of winding turns in a conical helical pattern.

In another preferred embodiment, the RF receiving coil includes a coiled electrical conducting element having a plurality of winding turns in a tightly wound ring pattern.

In yet another preferred embodiment, the at least one RF receiving coil includes a coiled electrical conducting element having a plurality of winding turns in a spiral pattern. In a further embodiment, the coiled electrical conducting element has between 3 and 500 complete windings of carbon nanotube material. In a yet further embodiment, the innermost windings of the coiled electrical conducting element are of a winding diameter of substantially 1 cm, and wherein the outermost windings of the coiled electrical conducting element are of a winding diameter of between 5 cm to 80 cm. In a still further embodiment, the electrical conducting element having a plurality of winding turns in a spiral patter, the plurality including at least three complete turns of winding. In another further embodiment, the RF receiving coil further includes a second coiled electrical conducting element having a plurality of winding turns in a spiral pattern, the second coiled electrical conducting element being serially connected, with the same sense of winding, to the coiled electrical conducting element having a sensor to sense position and orientation. In yet another further embodiment, the coiled electrical conducting element having a sensor to sense position and orientation and the second coiled electrical conducting element are separated by a distance between 2 mm and 15 mm. In still another further embodiment, further including between three and fifteen additional coiled electrical conducting elements in serial connection.

In another general aspect of the invention, a magnetic resonance imaging system includes a magnet system for providing a static inhomogeneous magnetic field within an imaging volume, such that the static inhomogeneous magnetic field is stronger in some portions of the imaging volume than in other portions of the imaging volume where the static magnetic field is weaker; and at least one RF receiving coil including a coiled electrical conducting element consisting essentially of carbon nanotubes, the at least one RF receiving coil being of a configuration, and being positioned, such that: a magnetic field of the RF receiving coil is stronger in some portions of the imaging volume than in other portions of the imaging volume where the magnetic field of the RF receiving coil is weaker, and the magnetic field of the RF receiving coil is stronger in the portions of the imaging volume where the static inhomogeneous magnetic field is weaker.

In another general aspect of the invention for use in a magnetic resonance imaging system, an RF receiving coil assembly is provided that includes a coiled electrical conducting element consisting essentially of carbon nanotube material; and RF receiving circuitry having a large quality factor.

In still another general aspect of the invention, a magnetic resonance imaging system is provided having an enhanced signal-to-noise ratio. The system includes a magnet system for providing a magnetic field; and at least one RF receiving coil assembly including: a coiled electrical conducting element consisting essentially of carbon nanotube material; and RF receiving circuitry having a quality factor greater than 15.

BRIEF DESCRIPTION OF THE DRAWINGS

The invention will be more fully understood by reference to the detailed description, in conjunction with the following figures, wherein.

DETAILED DESCRIPTION

Figure 1:
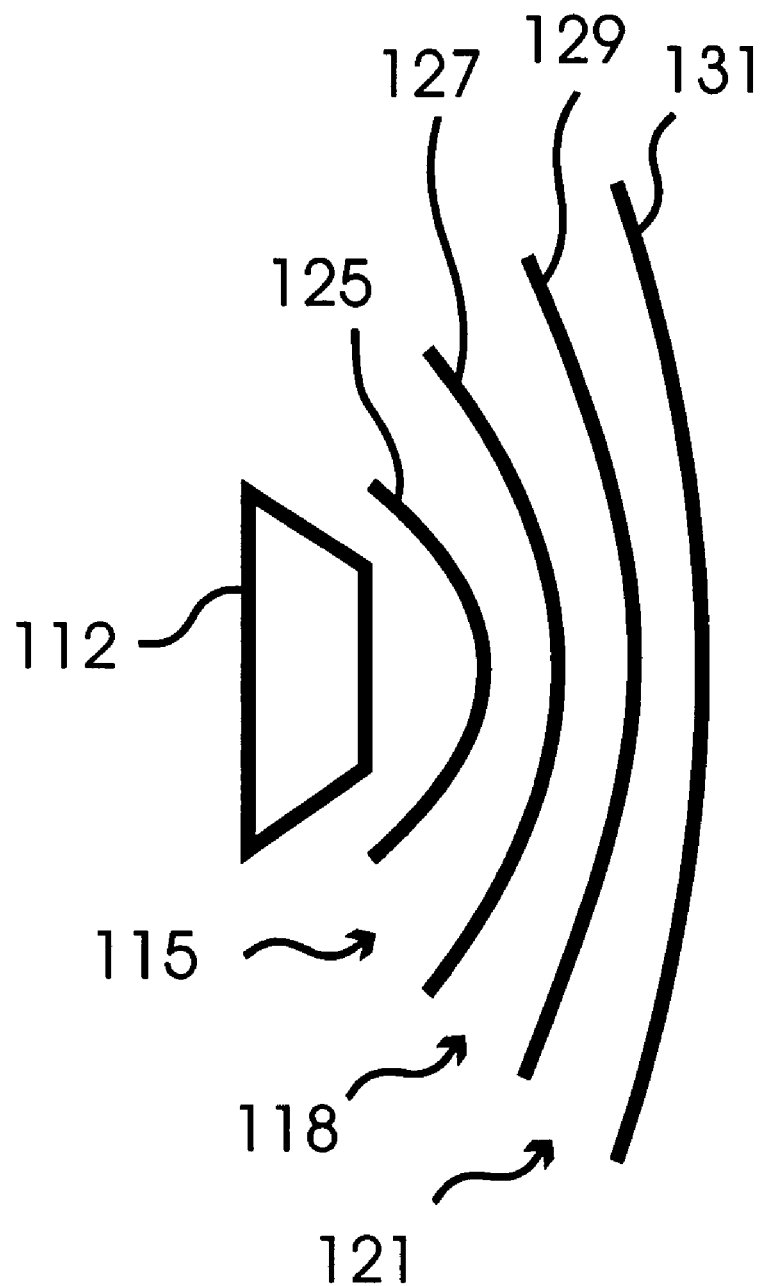
FIG. 1 is an illustration of a magnet system and an associated inhomogeneous static magnetic field pattern, as indicated by a plurality of constant magnitude iso-surfaces.

The imaging system of the present invention includes a magnet system having at least one magnet for producing either a homogeneous or an inhomogeneous static magnetic field within the desired volume to be imaged, together with at least one Radio Frequency (RF) transmission coil, and at least one RF receiving coil made of a ballistic electrical conductor, such as carbon in the form of carbon nanotubes.

Carbon nanotubes have many interesting electrical, mechanical and thermal properties. Specifically, they possess the property of ballistic electron transport, wherein the electrons transported by the conductor do not get significantly scattered during transport, such that the electrical resistance offered by the conductor to a current does not increase with length. In contrast, the resistance of a standard (metallic) electrical conductor increases linearly with length, other things being equal. Furthermore, ballistic conductors do not exhibit a skin effect such that resistance increases with frequency; in fact in the MHz frequency range characteristic of MR Imaging, carbon nanotubes demonstrate a weak decreasing dependence of resistance on frequency (for instance, this is discussed in Y. P. Zhao et al, *Physical Review B*, Volume 64, 2001, p. 201402(R)).

Recently, a process has been developed to fabricate useful lengths of carbon nanotube conductors in the form of thin sheets (M. Zhang et al, *Science*, Aug. 19, 2005, p. 1215). These thin sheets can be as thin as 50 nanometers. A receiving coil constructed of such a sheet can have very low intrinsic resistance due to its ballistic conductance properties and the absence of the skin effect common to metallic (scattering) conductors.

Image quality and image resolution in MRI depends directly on the Signal-to-Noise-Ratio obtained with the imaging coils used with the system. The overall Signal-to-Noise-Ratio (SNR) in Magnetic Resonance Imaging depends on the static field strength used in the system, as well as properties of the imaging coil used, and is determined by the following proportionality relationship:

$$SNR \sim (B_0)^2 B_1 / sqrt(R_{eff}) \quad (1)$$

where $B_0$ is the static field strength, $B_1$ is the field produced by the imaging coil per unit current flowing through it, and $R_{eff} = (R_{body} + R_{coil})$ is the effective resistance (also called net resistance) due to resistive losses in the patient body and in the imaging coil itself.

Thus, a more sensitive imaging coil (i.e., one with a larger $B_1$ field and a smaller effective resistance $R_{eff}$) can yield the same SNR when used with a smaller static magnetic field strength $B_0$; from the above relationship it is evident that every factor of 4 increase in coil SNR value, $B_1/sqrt(R_{eff})$, gives a twofold decrease in static field strength $B_0$ required to maintain the same SNR value. Correspondingly, the size of the MRI system needed for given image quality or resolution decreases as the coil SNR increases.

Imaging coils made of a ballistic conductor, such as carbon in the form of carbon nanotubes, can offer an order of magnitude increase in effective SNR. This is due to both the decreased intrinsic resistance $R_{coil}$ and the larger $B_1$ fields that can be produced by many winding turns of such a conductor (the resistance of this conductor does not increase significantly with increased length of winding) that can be used in the imaging coil. Fabricated in the form of a thin film, the weight of the imaging coil can be made small as well, even with many winding turns.

While the coils of the invention are made of carbon nanotube conductors, it is known in the art to connect the coils to electronic circuitry that typically employs metallic conductors, semiconductors; or a combination of metallic and semiconducting components. For example, a known method for connecting a carbon nanotube coil to a metallic element or electrode is discussed in Z. Wu et al, *Science*, Vol. 305, 27 Aug. 2004, p. 1273. Thus, one of average skill in the art can fabricate a carbon nanotube coil of the invention in a-form suitable for use with a Magnetic Resonance Imaging system by simply winding the carbon nanotube conductor in a desired geometry on a suitable substrate, such as a polymeric film, and attaching metallic conductors to the free ends of the carbon nanotube conductor. It is known to attach metallic conductors using well-known methods of deposition of a conducting metal, such as gold, copper, palladium, platinum, or silver. It is also known that such a deposition can be performed using known methods by direct application of a molten metal paste to form a carbon nanotube-metal junction, vapor deposition with application of mechanical pressure, using a sputtering process, or similar various other means familiar to those skilled in the art. As described in the above-mentioned reference, standard microlithographic techniques or masked deposition techniques are useful in this regard.

As is known in the art, such as taught in M. Zhang et al, *Science*, Aug. 19, 2005, p. 1215, carbon nanotube sheets can be attached serially to one another by taking advantage of the microwave absorption properties of carbon nanotubes. Under suitable irradiation with microwaves causing localized melting, nanotube-nanotube junctions can be formed, as well as nanotube-polymer substrate junctions or sandwiched constructions of nanotube-nanotube junctions encased in a surrounding substrate. By these means, if so required, distinct nanotube sheets, or stacks of sheets, are fused to one another while maintaining electrical connectivity. In one embodiment, such an extension technique or method of effectively creating a long length of conductor is used for the construction of specialized coil geometries, including multiple turns or windings or more complex constructions, including the geometries described elsewhere in the present invention.

It is known that carbon nanotube conductors can be either Single-Walled or Multi-Walled, and methods of construction of both are known and described in the literature. While Multi-Walled Nanotubes are employed in the sheet drawing method described in M. Zhang et al, *Science*, Aug. 19, 2005, p. 1215, for example, K. Hata et al, *Science*, Vol. 306, 19 Nov. 2004, p. 1362, describes a technique for the water-assisted synthesis of Single-Walled Carbon Nanotubes. This technique can provide patterned, highly organized nanotube structures including sheets and pillars and nanotube forests, from which further macroscopic structures such as sheets or films can be fabricated by means of a drawing process. It's known that the growth of the initial nanotube structures or forests can often benefit from the presence of catalysts, such as iron nanoparticles, together with a suitable substrate such as Silicon. In some cases a suitable doping agent, such as Hydrogen, can yield further decreases in resistance of sheets drawn from the nanotube forests. The advantages of doping of both Single-Walled Nanotubes and Multi-Walled Nanotubes are described, for example, in M. Zhang et al, *Science*, Aug. 19, 2005, p. 1215.

The examples of film or sheet construction methods in the above are discussed for illustrative purposes only. Those skilled in the art can devise alternate fabrication or construction methods without departing from the scope of the invention as claimed.

As an additional benefit, the low resistance of the imaging coils of the present invention can be used to build a coil assembly including receiving electronics circuitry with large Quality Factors. This means that little energy is dissipated in the circuitry, and more of the raw signal, is available for amplification and subsequent processing. It also means that very narrow signal bandwidths can be obtained, so that very precise imaging slice selection is possible. This is also useful for imaging with an inhomogeneous static field, where it is necessary to use a series of carefully tuned Radio Frequencies over a suitable frequency range to acquire data from a series of suitably shaped spatial slices for subsequent processing and image reconstruction.

In a preferred embodiment, the carbon nanotube imaging coil is connected to electronic circuitry to select the correct tuning to ensure maximal response within a narrow bandwidth centered around a Radio Frequency whose signal pickup (from the volume to be imaged) is desired, so as to provide an optimally resonant signal. It is well-known that the circuitry can also include signal amplification. One skilled in the art knows that the imaging coil generally has a particular set of electrical characteristics such as resistance, impedance and capacitance associated with it. One skilled in the art also knows that the electronic circuitry generally contains standard components such as resistors, capacitors and inductors arranged is such a manner as to obtain the desired resonant response centered around the frequency of interest. Various circuit designs are possible and the specific design of such electronics can depend on convenience, ease of implementation and optimality, as is familiar to those skilled in the art.

It is also known that the circuitry could also include means of detuning the imaging coil during a transmit phase when other transmit coils are used to transmit the RF signals that generate proton precession in the sample or anatomy to be imaged. Further, it's known that detuning prevents large currents from being induced in the imaging coil during the transmit phase. Such detuning can be accomplished by the appropriate use of PIN diodes or other standard methods known to those skilled in the art, and the detuning can be driven by an appropriate voltage signal as is standard. It's known that selectively variable capacitors or varactors can also be used as part of the electronic reception circuitry. As is known in the art, the circuit can be designed to provide a suitably high circuit Quality Factor. Typically, the circuitry is designed to match input impedance into the MR imaging system as the signal from the electronic circuitry is fed to the MR imaging system through suitable means, such as a coaxial cable. Such circuitry is described, for instance, in E. Atalar et al, "High Resolution Intravascular MRI and MRS using a Catheter Receiver Coil", *Magnetic Resonance in Medicine*, Vol. 36, No: 4, pp. 596-605, October 1996.

In the case where the static magnetic field is inhomogeneous and multiple Radio Frequencies need to be picked up, coil electronics can be provided by one of skill in the art to achieve optimal resonant response across the entire range of frequencies by suitable active tuning of the electronic components, for instance by voltage-driven capacitors. The specific circuit design elements mentioned here are for illustrative purposes, and other design elements can be used by those skilled in the art while remaining within the scope of the present invention as claimed. (See, for example, E. Atalar et al, "High Resolution Intravascular MRI and MRS using a Catheter Receiver Coil", Magnetic Resonance in Medicine, Vol 36, No. 4, pp. 596-605, October, 1996.)

In one embodiment, the same RF coil can be used for both transmission and reception of RF signals. In another embodiment, different RF coils are used for transmission and for reception. In the case of either of these embodiments, the electrical conductor in at least one receiving coil is made of a ballistic conductor such as carbon nanotubes. The static magnetic field is produced by at least one magnet suitably disposed about the imaging volume. The at least one magnet may be a permanent magnet constructed of a high-grade magnetic material such as Neodymium-Iron-Boron, or it can be a superconducting magnet with the magnetic field generated by running large currents through the superconductor.

In one preferred embodiment, the magnet system is specialty designed to produce a tailored inhomogeneity pattern of the magnetic field within a suitable volume intended to be used as the imaging volume. In this case, the spatial field gradient distribution is carefully configured. The range of variation of the field strength values is sub-divided into a series of field strength increments, each of which corresponding to, and imaged with, a particular Radio Frequency, thereby implementing slice selection.

RF pulses are applied over the range of relevant frequencies either as a series of predominantly single frequency pulses, or as pulses incorporating several relevant frequencies, or as a completely broadband signal encompassing the entire frequency range. These RF pulses serve to tip or flip the proton spins in the selected slices. Subsequently, the spins precess to align themselves with the local static field, and in the process, emit RF radiation picked up by the receiving/imaging coils. In one embodiment, while RF signals emitted by spins precessing in a slice corresponding to a first frequency range are picked up by the receiving coil, an RF pulse over a second frequency range is transmitted by a separate transmitter coil. In this manner, RF signal acquisition and transmission can be interleaved. At least one set of gradient field-producing coils can be present and used to spatially encode proton density as done with standard MR imaging.

In another preferred embodiment, the static magnetic field used with the carbon nanotube conductor imaging coil is designed to be homogeneous as in a standard MRI system, and the signal acquisition process follows a standard pattern.

FIG. 1 schematically illustrates an inhomogeneous magnetic field pattern. The gradient that exists in this pattern can be used for imaging purposes. More specifically, the isosurfaces 125, 127, 129 and 131 of constant magnetic field magnitude produced by the magnet 112 are known. For illustrative purposes only, typical field strengths within the volume of interest may range from 0.1 Tesla to 0.5 Tesla. In one preferred embodiment, the field strength can be as low as 0.03 Tesla in the portion of the imaging volume where the static field is lowest and as high as 0.7 Tesla in the portion of the imaging volume where the static field is highest. For imaging purposes, the field pattern is divided into zones in steps of approximately 0.008 Tesla. Such zones 115, 118 and 121 are shown in FIG. 1. Each zone is sensitive to RF excitation tuned to a center frequency corresponding to the associated field strength. As the spins in each zone are excited by RF transmission, a ballistic conductor imaging coil is used to pick up the subsequent relaxation RF signal as the signals precess back into alignment with the static magnetic field. The ballistic conductor used in the imaging coil can provide SNR gains of a factor lying at least in the range 10 to 20 over existing standard MR imaging coils (made of metallic conductors). As mentioned earlier, an increase in SNR by a factor of 16 implies a four-fold reduction in static field strength magnitude needed to maintain image quality. Thus, a Magnetic Resonance Imaging system with a 0.35 Tesla static magnetic field strength constructed according to the teachings of the present invention can offer an image quality and resolution comparable to that obtained with a standard 1.5 Tesla MRI system.

Figure 2:
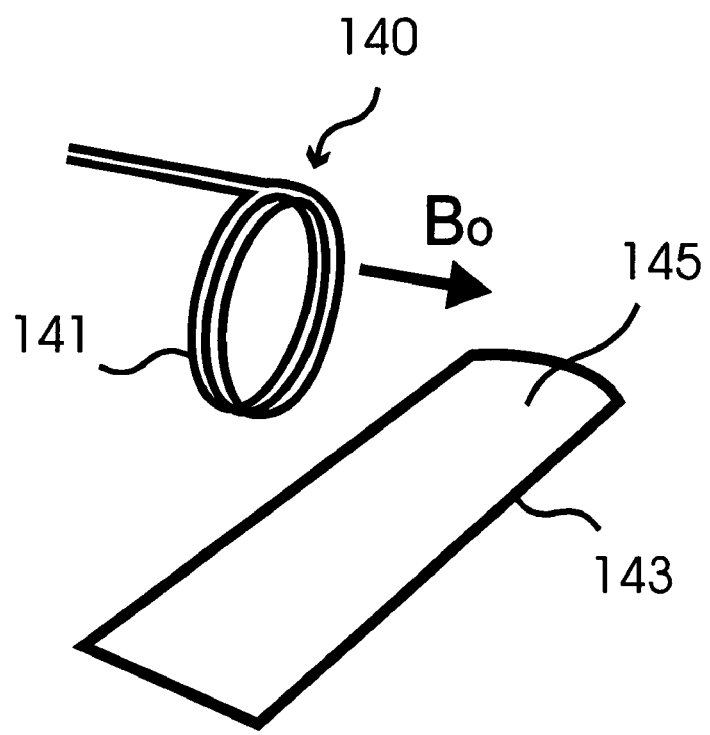
FIG. 2 is an illustration of a ballistic conductor imaging coil in the form of a tightly wound ring coil.

FIG. 2 shows an imaging coil 140 embodiment constructed with its electrical conductor in the form of a thin carbon nanotube film structured as a tightly wound ring 141 with a film thickness between 20 nanometers and 500 microns and with at least 3 turns of winding. The winding diameter can be in the range 5 cm to 80 cm. This figure also shows the general direction of the static magnetic field $B_0$ produced by a permanent magnet that is part of the system (not shown). The patient table 143 is shown for clarity with its head 145. In the configuration shown the coil is mounted on a lateral side of the patient to be imaged.

Figure 3:
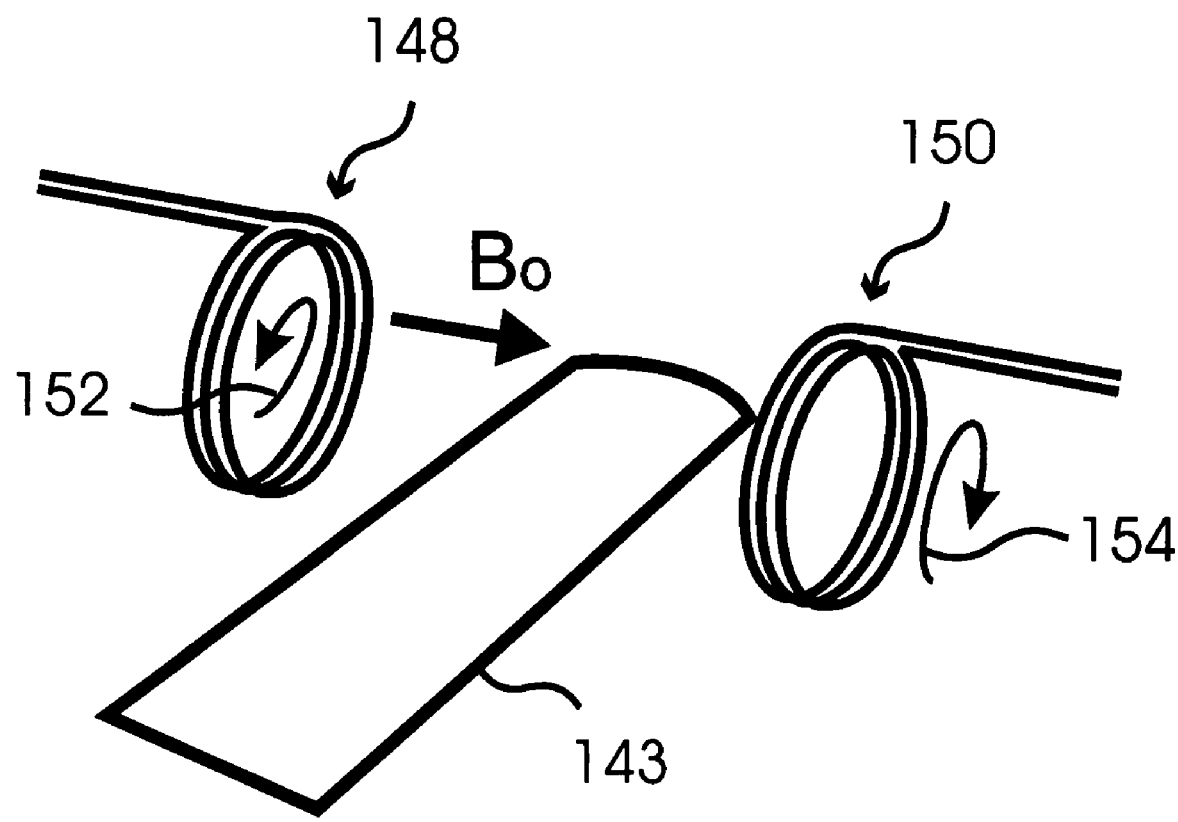
FIG. 3 is an illustration of a ballistic conductor imaging coil configuration in the form of a pair of phased array ring coils.

Alternatively, FIG. 3 shows an opposed pair 148, 150 of tightly wound rings of carbon nanotube film with a film thickness between 20 nanometers and 500 microns, and with at least 3 turns of winding, which can be used on either lateral side of the patient. This pair of rings/imaging coils 148, 150 can be used for MR imaging in standard phased array form. The senses of winding 152 and 154 of coils 148, 150, respectively, are opposed and are indicated for each winding. The general direction of the static magnetic field $B_0$ is also shown.

Figure 4:
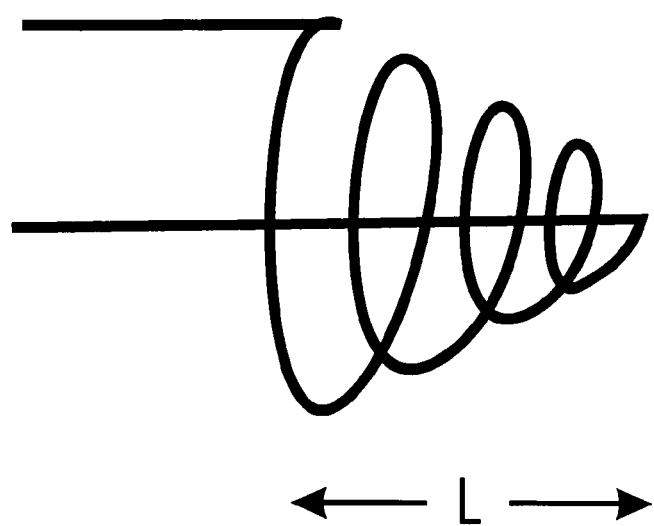
FIG. 4 is an illustration of a ballistic conductor imaging coil in the form of a generalized helical coil.

FIG. 4 shows an imaging coil embodiment constructed as a generalized conical helical carbon nanotube winding with turns of progressively smaller winding diameter in the portion of the coil closer to the patient. The axial length L of the winding can be as high as about 8 cm; the largest winding diameter is in the range 5 cm-80 cm and the smallest winding diameter can be up to 20 times smaller than the largest winding diameter. The total number of turns of winding can be in the range 3 to 500. The coil is mounted on a lateral side of the patient to be imaged. Again, an opposed pair of such generalized conical helical coils placed on lateral sides, of the patient can be used in phased array form to further optimize the SNR.

Figure 5:
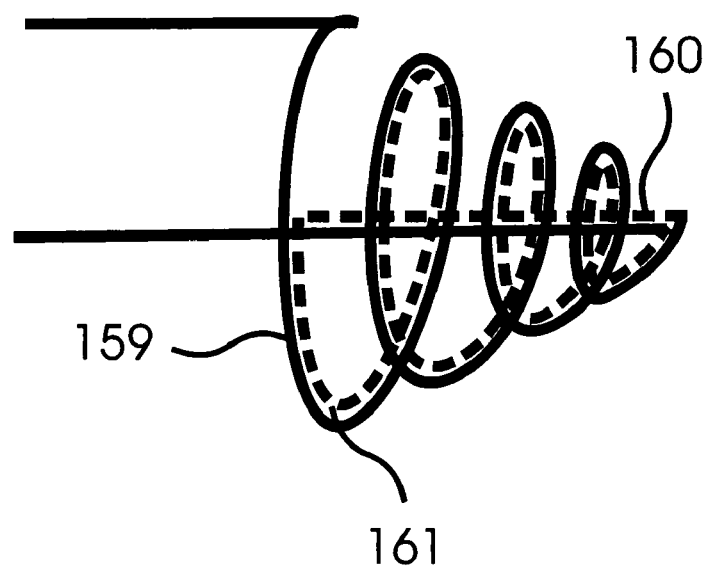
FIG. 5 is an illustration of a ballistic conductor imaging coil configuration in the form of a repeated generalized helical coil.

FIG. 5 is an illustration of an imaging coil embodiment constructed as a repeated generalized conical helical carbon nanotube winding with turns of progressively smaller winding diameter in portions of the coil closer to the patient. The first winding helix 159 is followed by a second winding helix 161. The axial length of the winding of each helix can be as long as about 8 cm; the largest winding diameter is in the range 5 cm-80 cm and the smallest winding diameter can be up to 20 times smaller than the largest winding diameter. After the smallest diameter winding turn of the first winding helix 159, the conductor is routed back axially 160 to near the axial section of the largest diameter winding turn and the generalized conical helical winding pattern is repeated 161 with a possible axial offset. The total number of turns of winding of each winding helix can be in the range 3 to 500. The number of distinct winding helixes can be between 2 and 20 wherein two distinct winding helixes are shown in FIG. 5. The coil is mounted on a lateral side of the patient to be imaged. Again, an opposed pair, or other multiplicity, of such generalized conical helical coils placed on lateral sides of the patient can be used in phased array form to further optimize the SNR.

Figure 6:
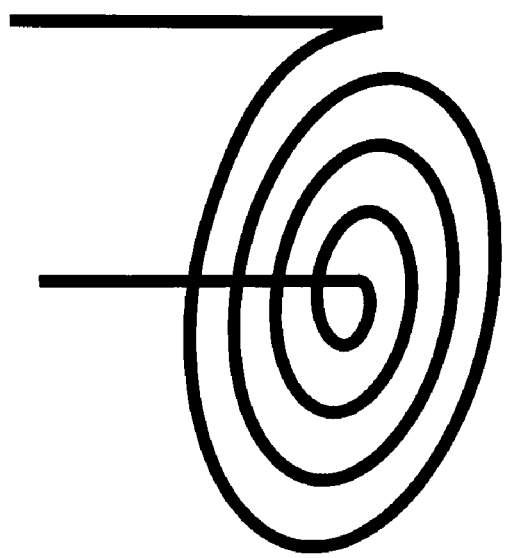
FIG. 6 is an illustration of a ballistic conductor imaging coil in the form of a spiral pancake coil.

FIG. 6 shows an imaging coil embodiment constructed in a spiral pancake winding pattern with carbon nanotube conductor. The innermost winding diameter is of the order of about 1 cm and the outermost winding diameter is in the range 5 cm-80 cm. The total number of turns of winding can be in the range 3 to 500.

Figure 7:
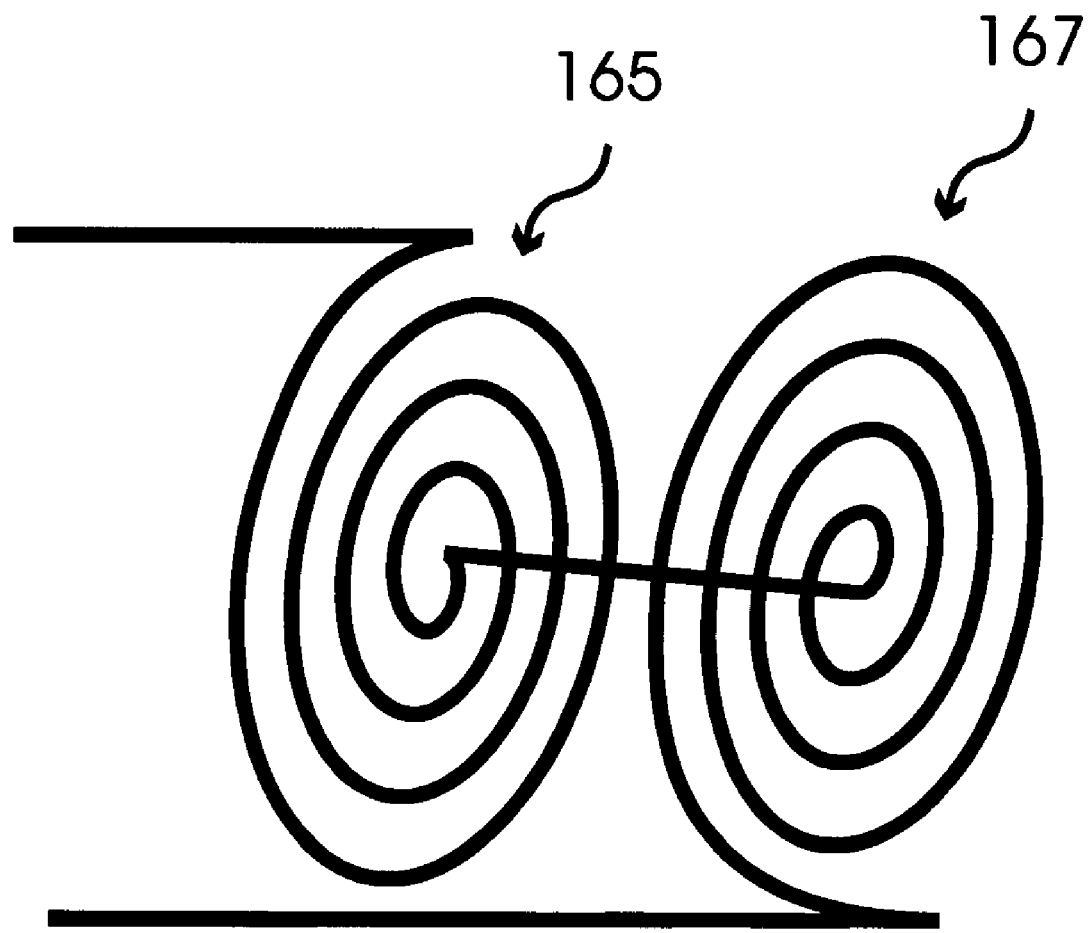
FIG. 7 is an illustration of a ballistic conductor imaging coil configuration in the form of a layered spiral pancake coil.

FIG. 7 shows an imaging coil embodiment including two parallel planar coils 165 and 167 of spiral pancake windings of carbon nanotube conductor. The two parallel planar coils are serially connected with the same sense of winding (about the winding axis) in each planar coil, as shown. Each planar coil can have dimensions as associated with a single spiral pancake mentioned regarding FIG. 6. The distance between the parallel planar coils can be between 2 mm and 15 mm; there can be between two and fifteen such planar coils that are serially connected to form the imaging coil.

Figure 8:
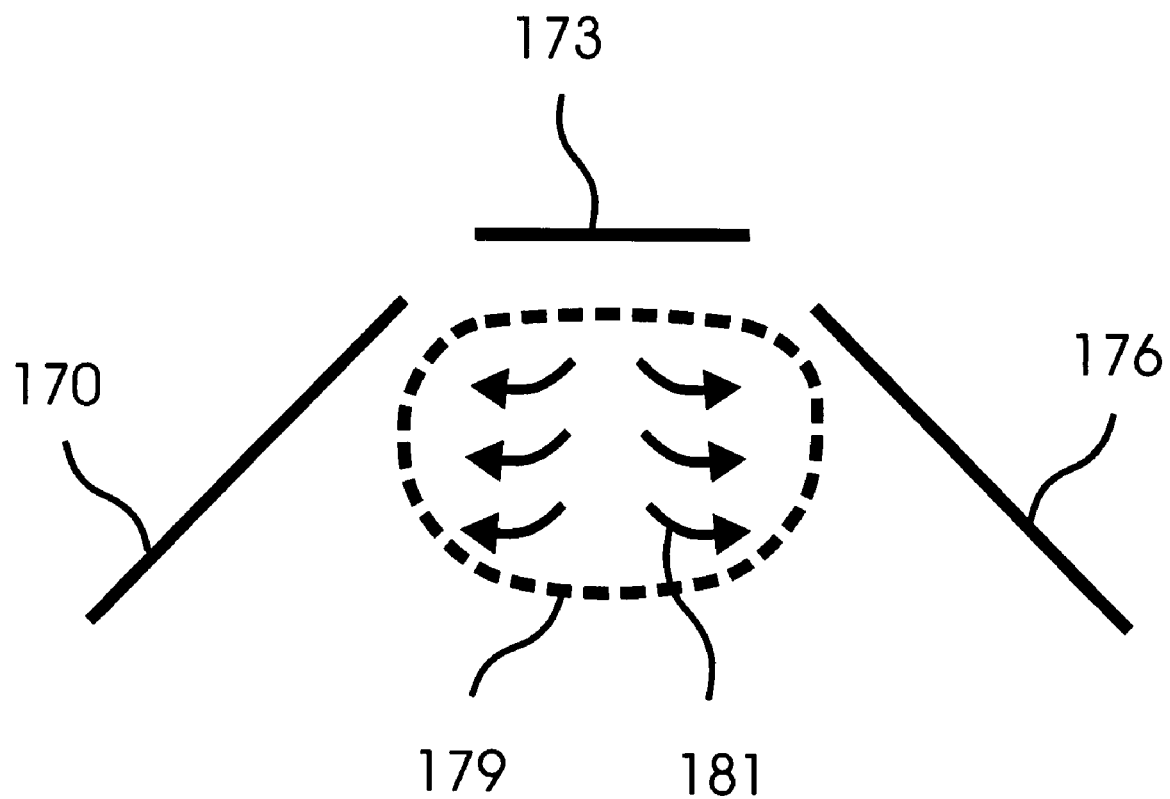
FIG. 8 is an illustration of a ballistic conductor imaging coil configuration in the form of a trio coil.

FIG. 8 shows a preferred embodiment as a trio of imaging coils 170, 173 and 176 seen edge-on. Within the imaging region 179 shown, the net $B_1$ field 181 produced by the trio of coils has a strong radial component. The set of three coils 170, 173 and 176 is used in phased array form in a preferred embodiment. In an alternate embodiment they are serially connected. Each of the individual coils can be any one of the types described herein and can be constructed according to the invention. Generally, the coil trio partially surrounds a patient during imaging. The angles between the three coils as well as the spacing between them and the overall geometric layout are all carefully chosen to optimize the size and shape of the imaging region and the $B_1$ field within it; one skilled in the art would be familiar with the optimization process. In one preferred embodiment, the entire coil structure is mounted within a rigid frame such that the angles between the coils 170, 173 and 176 and the entire coil configuration cannot change. In an alternate preferred embodiment the coils 170, 173 and 176 are mounted in a flexible frame that permits changes in angles between the coils 170, 173 and 176 when the entire configuration is placed around a patient.

Figure 9:
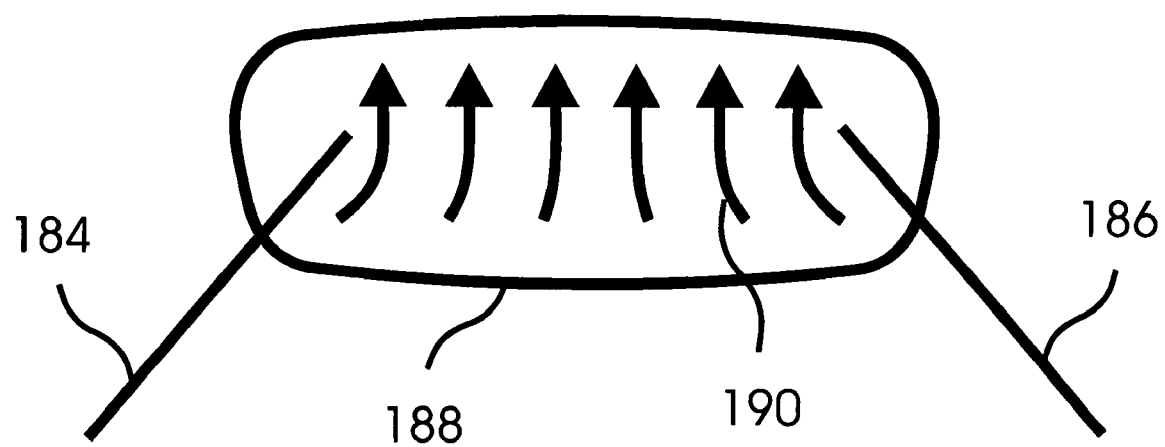
FIG. 9 is an illustration of a ballistic conductor imaging coil configuration in the form of an angled pair coil.

FIG. 9 illustrates a preferred embodiment in the form of angled pair of imaging coils 184, 186 seen edge-on. The angled pair 184, 186 is configured such that within the imaging region 188 shown, a significantly homogeneous and optimized $B_1$ field 190 is produced by the coil pair 184 and 186. Each of the individual coils 184, 186 can be any one of the types described above. The spacing between the coils 184, 186, their size and the angle between them are all carefully chosen to optimize the size and shape of the imaging region and the $B_1$ field within it; one skilled in the art would be familiar with the optimization process. The coils can be serially connected or they can be used as a phased array. In one preferred embodiment the entire coil structure is mounted within a rigid frame such that the angle between the coils and the entire coil configuration cannot change. In an alternate preferred embodiment the coils are mounted in a flexible frame that permits changes in the angle between the coils when the entire configuration is placed around a patient.

In one set of preferred embodiments the above coil configurations can all be used as fixed configurations and immovably located for imaging purposes. In an alternate set of preferred embodiments each coil type can be moved around the patient by an operator and placed as convenient near different sides of the patient to image different regions of the patient anatomy so as to provide maximum SNR within each region during a process of dynamic scanning. In a preferred embodiment of this invention, such a movable coil as described here is further equipped with at least one Micro Electro Mechanical System (MEMS) sensor that can measure linear as well as angular accelerations and thence, by appropriate integration, yield spatial positional and orientational information for the imaging coil. This spatial positional information can be used by the system to automatically select an optimal and limited spatial region within which the image is reconstructed as the coil is moved around the patient in various locations. Thus as the coil is moved around, image acquisition is tailored to provide a set of optimal imaging regions that are subsequently "stitched" together by system software to produce a complete reconstruction of the desired patient anatomy.

Figure 10:
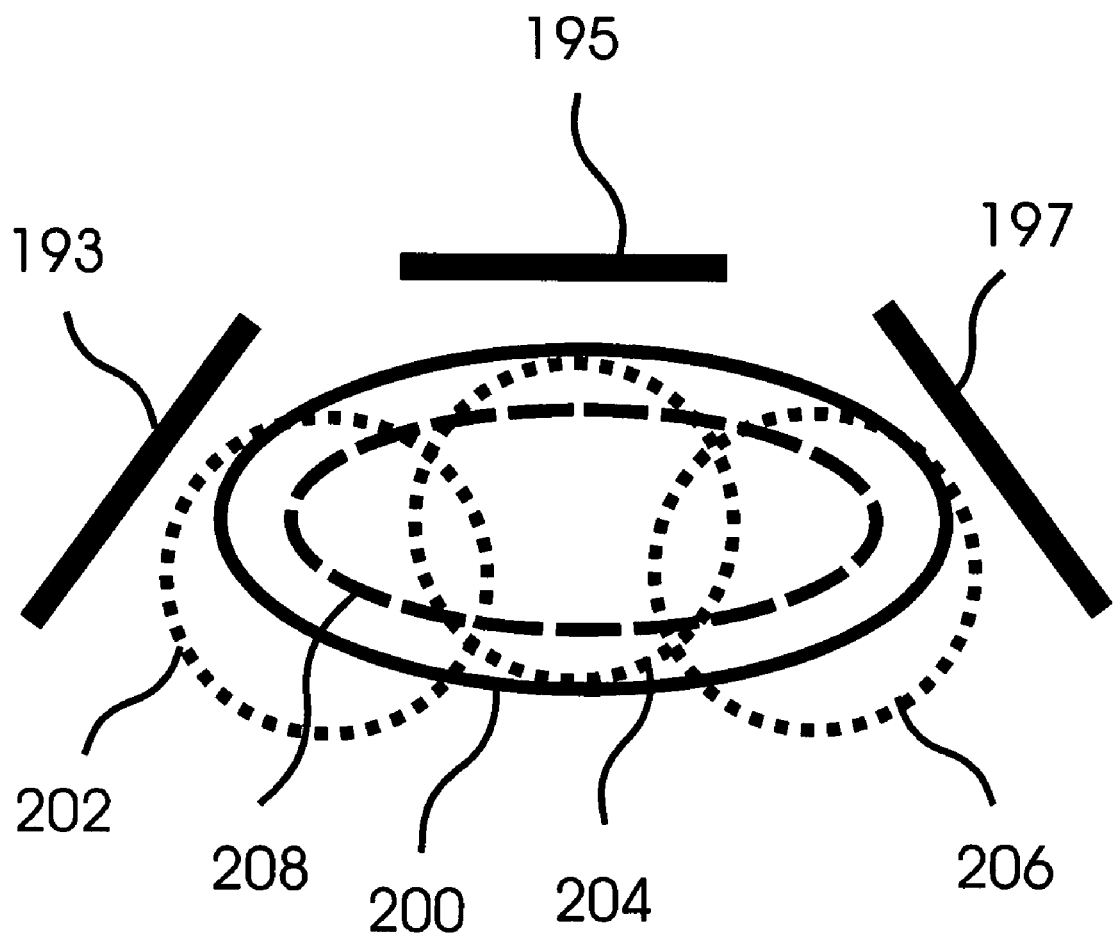
FIG. 10 is an illustration depicting three positions of a moveable ballistic conductor imaging coil configuration having a coil in each of three locations and their respective imaged volumes, as used in dynamic scanning of a complete three dimensional volume of interest.

FIG. 10 depicts dynamic scanning with a single coil that is moved by an operator and located in the three positions 193, 195 and 197 shown to provide an optimal image in each of three possibly partially overlapping regions 202, 204 and 206 within the patient cross-section 200. The system software stitches these three regions into a single encompassing region 208 that provides a complete three dimensional image of the entire volume of interest.

The static magnetic field $B_0$ can be designed to be homogeneous as in a standard MRI system, or it can be designed to produce a specific, known, magnetic field pattern with known gradients everywhere in the region of interest. In the latter case, the tuning of the imaging coil and associated circuitry is designed to permit variable tuning over a range of resonant frequencies that corresponds to the range of static field strengths within the imaging volume. For example a varactor can be used to achieve such variable tuning and switch between different frequency bands. Additionally, the patient table, the system magnet, or the imaging coil, or any combination of these, can be moved and repositioned to scan different portions of anatomy for subsequent three dimensional volumetric reconstruction of the entire anatomy of interest. Specialized image acquisition and processing modalities, as known to those skilled in the art, can be used to acquire real-time or dynamic images of non-static organs such as a beating heart. One consequence of using imaging coils with ballistic conductors as disclosed in the present invention is that the higher SNR available with such coils permits faster image acquisition, so that dynamic images can be acquired in a much more real-time fashion than conventionally possible. The number of gradient coils used for spatial encoding of proton density can vary from 1 to 8 in MRI systems built according to the teachings of the present invention, as a non-limiting example provided for purposes of illustration.

Figure 11:
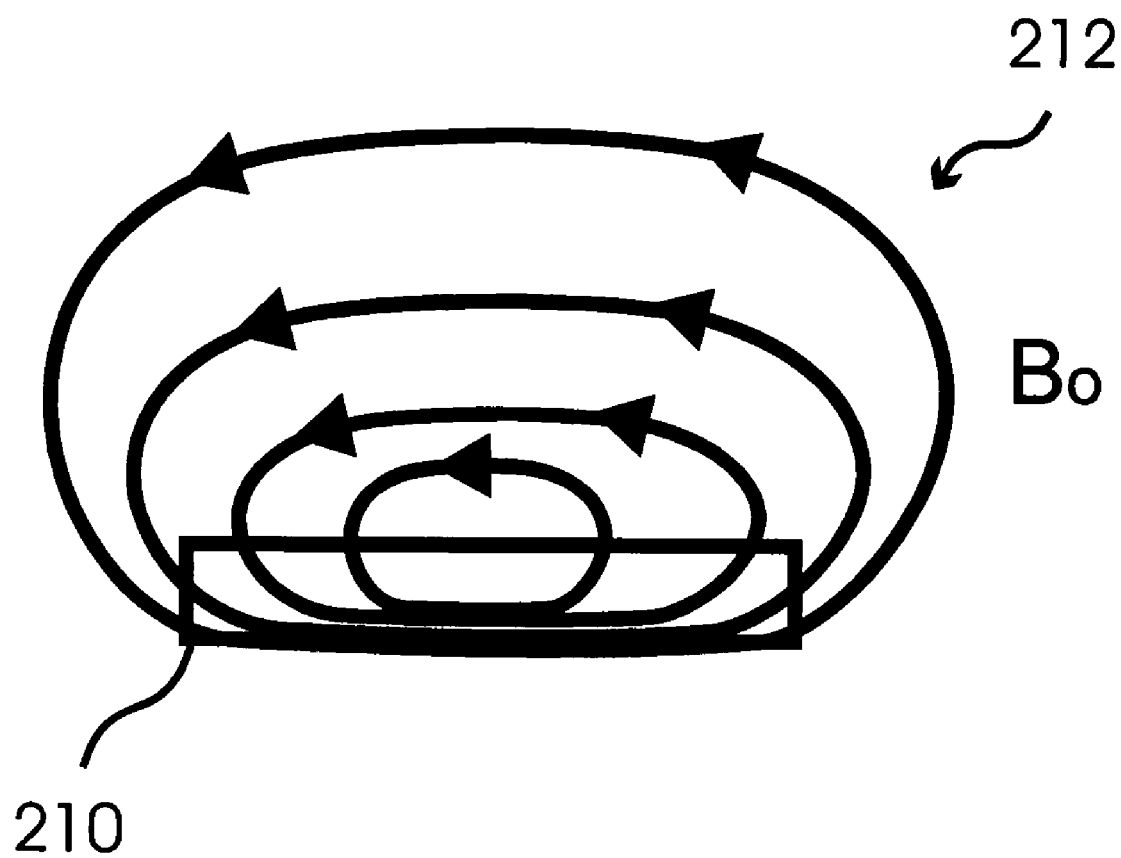
FIG. 11 is a schematic illustration of a first magnet system embodiment.

Several magnet system configurations are possible which can be used for optimal imaging together with the imaging coil designs described herein. FIG. 11 shows a preferred embodiment of a permanent magnet configuration 210 in a trans-axial view (view from patient feet) with the magnet below the patient. Within the imaging volume the $B_0$ field lines 212 cross the imaging volume laterally from one side to another as shown. In one preferred embodiment there can be a vertical gradient in the magnetic field. In an alternate preferred embodiment the magnet is carefully designed to produce a substantially homogeneous magnetic field within the imaging volume. In another preferred embodiment the magnet can be likewise located above the patient. In still another embodiment there can be more than one permanent magnet (one above and one below the patient, for instance) and each magnet is designed to optimize net field and gradient properties within the imaging volume. The ring coil of FIG. 2, the conical helical coil of FIG. 4, the spiral pancake coil of FIG. 6, the layered spiral pancake coil of FIG. 7, the repeated helical coil of FIG. 5, and the angled pair coil of FIG. 9, can all be used with this system magnet design.

Figure 12:
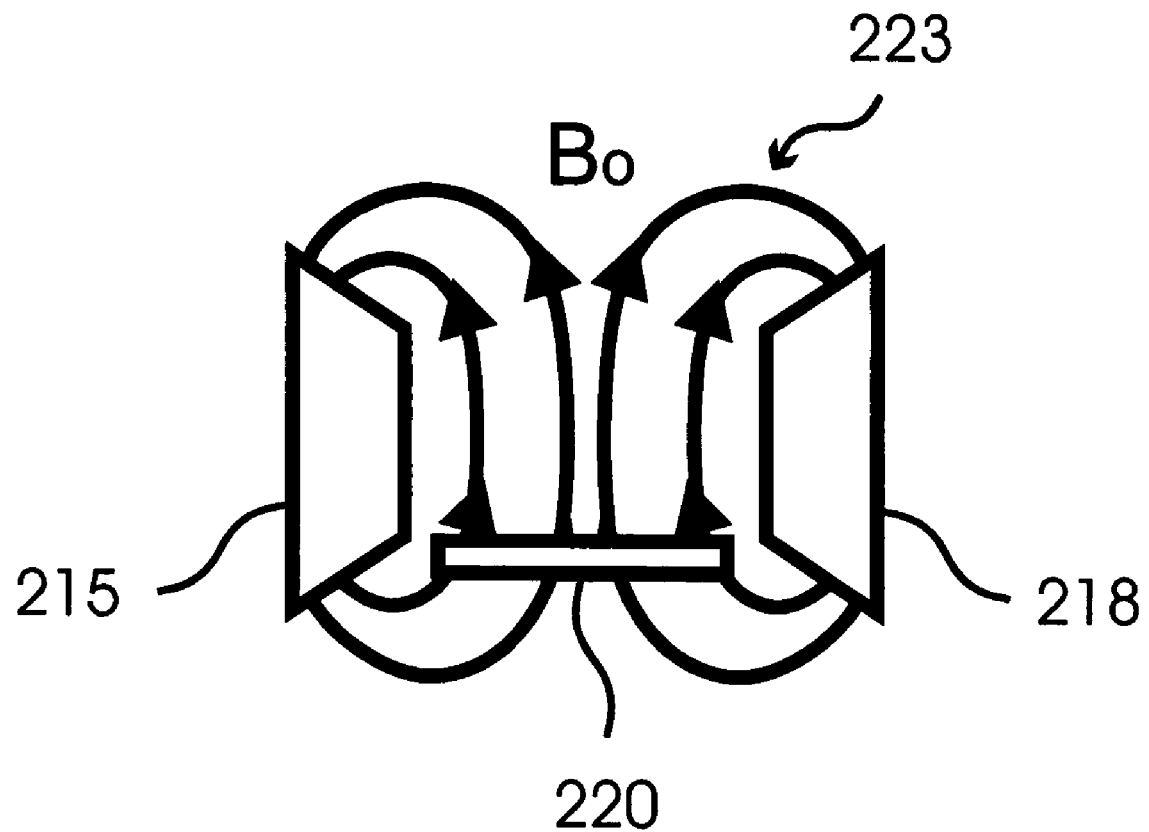
FIG. 12 is a schematic illustration of a second magnet system embodiment.

In a second preferred embodiment of system magnet, there are two magnets on either lateral side of the patient. FIG. 12 shows this prefer embodiment of a permanent magnet configuration in a trans-axial view (view from patient feet) with the magnets 215 and 218 disposed laterally with respect to the patient, together with schematic $B_0$ static field line patterns 223. The table edge 220 from patient feet perspective is also shown for clarity. Any of the coil types previously described can be used with this system magnet configuration.

Figure 13:
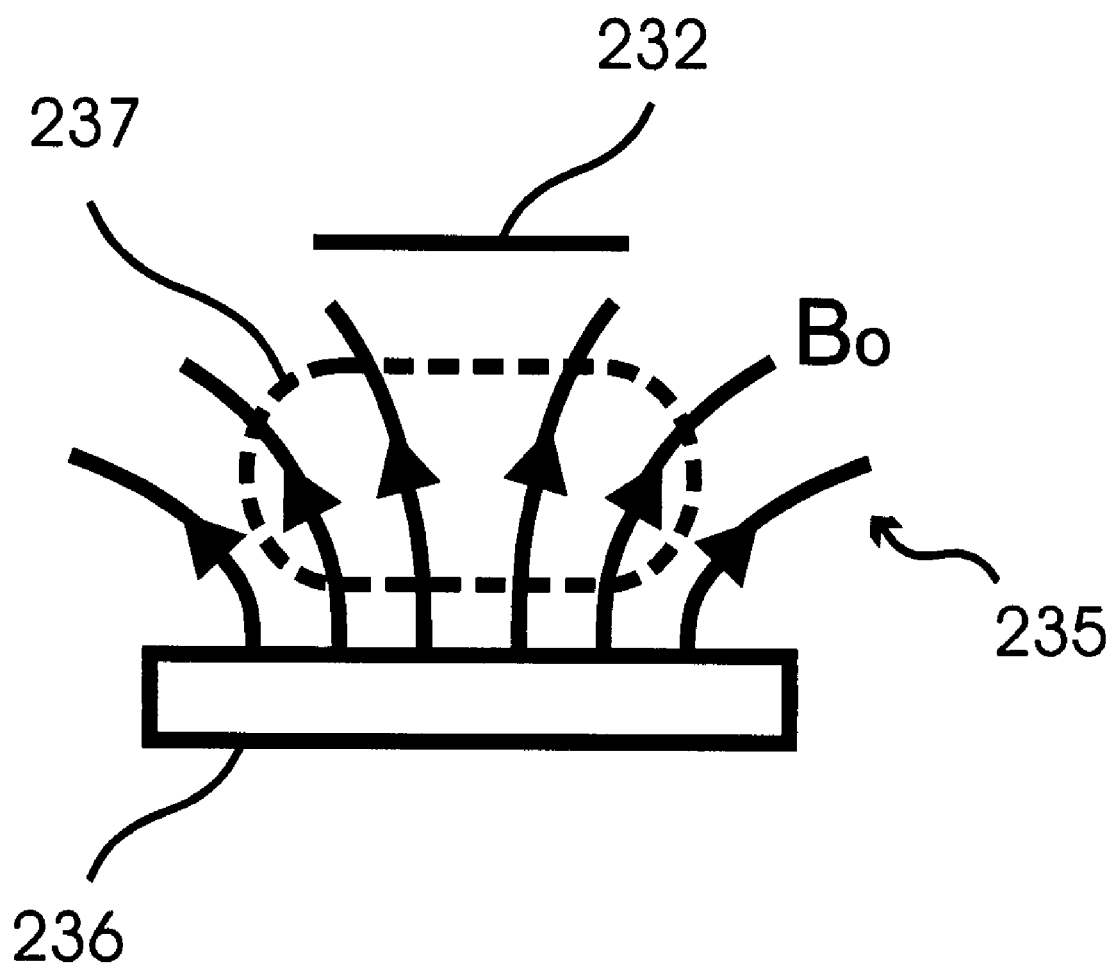
FIG. 13 is a schematic illustration of a third magnet system embodiment.

FIG. 13 illustrates another preferred embodiment of system magnet, where the field lines 235 emanate from the magnet 230 directly into the imaging volume 237. In the trans-axial view shown (view from patient feet), we can also see the imaging coil 232 edge-on. The imaging coil can be any one of the following types previously described: ring coil (FIG. 2), helical coil (FIG. 4), spiral pancake coil (FIG. 6), layered spiral coil (FIG. 7), repeated helical coil (FIG. 5), or the trio coil configuration (FIG. 8). A useful property of the system configuration here is that in this system and coil configuration, while $B_0$ decreases in magnitude away from the magnet, the $B_1$ field produced by the imaging coil increases away from the magnet. Thus, the effective SNR in this system embodiment can be high everywhere within the imaging volume in light of equation (1). By suitable design and positioning of the imaging coil(s) together with the system magnet, the SNR within the imaging volume can be everywhere optimized.

A method of magnetic resonance imaging can also include receiving electrical signals using at least one RF receiving coil including a coiled electrical conducting element consisting essentially of carbon nanotube material, and including at least one sensor to estimate position and orientation of the RF receiving coil. This method includes acquiring high signal-to-noise-ratio RF signals from an imaging volume with the receiving coil in the presence of a static magnetic field with the receiving coil in a fixed spatial configuration; moving the RF receiving coil to a second spatial configuration and acquiring RF signals from the imaging volume with the RF receiving coil in the second spatial configuration; using the position and orientation information of the RF receiving coil in both configurations to process the RF signals thereby obtained to calculate image intensity in at least two image sub-volumes; and automatically combining the image intensities in the two image sub-volumes so as to create a three dimensional image intensity reconstruction of the entire imaging volume.

In a preferred embodiment, more than two receiving coil spatial configurations are used to reconstruct more than two corresponding image sub-volumes from which the three dimensional image intensity reconstruction of the entire imaging volume can be automatically combined.

In another preferred embodiment, the position and orientation of the RF receiving coil is also used to normalize the image intensity distribution of the reconstructed image.

Other system and coil configurations and variations besides the ones described above can be designed by those skilled in the art of MR Imaging and following the teachings herein.

Other modifications and implementations will occur to those skilled in the art without departing from the spirit and the scope of the invention as claimed. Accordingly, the above description is not intended to limit the invention except as indicated in the following claims.

What is claimed is:

1. A magnetic resonance imaging system comprising:
    a magnet system for providing a static magnetic field; and
    at least one RF transmission coil assembly having at least one coiled electrical conducting element consisting essentially of carbon nanotube material.

2. A magnetic resonance imaging system comprising:
a magnet system for providing a static magnetic field;
at least one RF transmission coil assembly having at least one electrical conducting element consisting essentially of carbon nanotube material; and
at least one RF receiver coil assembly having at least one electrical conducting element consisting essentially of carbon nanotube material.

3. The system of claim 2, where the at least one electrical conducting element in the at least one RF transmission coil assembly is the at least one electrical conducting element in the at least one RF receiver coil assembly.

4. The system of claim 2, where the at least one RF receiver coil assembly includes electronic circuitry for tuning and impedance matching.

5. The system of claim 3, where the at least one RF transmission coil assembly and the at least one receiver coil assembly share electronic circuitry for tuning and impedance matching.

6. The RF transmission coil of claim 1, wherein the at least one electrical conducting element is capable of carrying electrical current densities in excess of current densities that can be supported in a normal metallic conductor of similar thickness.

7. For use in a magnetic resonance imaging system, an RF transmission coil assembly including:
an electrical conducting element consisting essentially of carbon nanotube material that can carry current densities in excess of those that can be supported in a normal metal of similar thickness.

8. A magnetic resonance imaging machine RF transmission coil assembly, including:
a coiled electrical conducting element comprising carbon nanotube material that can carry current densities in excess of those that can be supported in a normal metal of similar thickness.

\* \* \* \* \*